United States Patent [19]
Tanaka

[11] Patent Number: 5,981,313
[45] Date of Patent: Nov. 9, 1999

[54] STRUCTURE AND METHOD FOR PACKAGING A SEMICONDUCTOR DEVICE

[75] Inventor: Kei Tanaka, Tokyo, Japan

[73] Assignee: NEC Corporation, Tokyo, Japan

[21] Appl. No.: 08/943,010

[22] Filed: Oct. 2, 1997

[30] Foreign Application Priority Data

Oct. 2, 1996 [JP] Japan ................................. 8-262139

[51] Int. Cl.$^6$ ............................ H01L 21/44; H01L 23/29
[52] U.S. Cl. ..................... 438/118; 438/124; 438/119; 257/788; 257/789; 257/795
[58] Field of Search .................... 438/118, 119, 438/124, 126, 127; 257/788, 789, 794, 795

[56] References Cited

U.S. PATENT DOCUMENTS

| | | | |
|---|---|---|---|
| 5,014,111 | 5/1991 | Tsuda et al. | 438/617 |
| 5,668,059 | 9/1997 | Christie et al. | 438/118 |
| 5,717,477 | 2/1998 | Fritz et al. | 438/118 |

FOREIGN PATENT DOCUMENTS

| | | |
|---|---|---|
| 3-29207 | 2/1991 | Japan . |
| 3-209831 | 9/1991 | Japan . |
| 3-209840 | 9/1991 | Japan . |
| 4-91446 | 3/1992 | Japan . |
| 5-297401 | 11/1993 | Japan . |
| 9-107002 | 4/1997 | Japan . |
| 9-162229 | 6/1997 | Japan . |

OTHER PUBLICATIONS

Toshiyasu Shimada et al., "Leadless Bare Chip attachment Technology for Low–Cost MCM–L", *Microjoining and assembly Technology in Electronics*, Feb. 1–2, 1996, pp. 193–196.

"General Electronic Components for Packaging", *Nikkei Micro–devices*, Micro–devices, Mar. 1996, pp. 146–147.

*Primary Examiner*—Kevin M. Picardat
*Attorney, Agent, or Firm*—Sughrue, Mion, Zinn, Macpeak & Seas, PLLC

[57] ABSTRACT

The packaging structure for a semiconductor device according to this invention is formed by mounting a semiconductor chip 1 on a wiring board 4 to connect it to the electrodes 5 of the wiring board 4, and filling a sealing resin 7, obtained by mixing a filler material 8 for lowering the coefficient of thermal expansion in a base resin, in the gap formed between the semiconductor device and the wiring board. The sealing resin 7 is separated to a first part 9 with small amount of the filler material and is composed mostly of the base resin, and a second part 10 with an amount of the filler material more than in the first part. With this constitution, the second part is consists of a material with smaller coefficient of thermal expansion than that of the first part. The first part and the second part are separated after completion of the filling of the sealing resin 7. The separation can be carried out with high efficiency by utilizing the centrifugal force produced in the rotation of the entirety of the semiconductor device and the wiring board.

15 Claims, 5 Drawing Sheets

STRUCTURE AND METHOD FOR PACKAGING A SEMICONDUCTOR DEVICE

BACKGROUND OF THE INVENTION

1. Field of the Invention

The present invention relates to a packaging structure for packaging a semiconductor device on a wiring board and its mounting method, and more particularly to a packaging structure for packaging a semiconductor device according to flip-chip method and its packaging method.

2. Description of the Prior Art

In recent years, the structure for packaging semiconductor devices on a wiring board with high density is being simplified accompanying the reduction in the size and cost of the electronic equipment. As a high density packaging structure for the semiconductor devices having such a simplified constitution, there is proposed a flip-chip method.

The packaging structure for the semiconductor device according to the conventional flip-chip method is disclosed in a paper entitled "Leadless Bare Chip Packaging Technology and Its Application to MCM-L", Mate "96, February, 1996, pp. 193–196 and in a paper entitled "General Electronic Components for Packaging", Nikkei Micro-devices, March issue, March, 1996, pp. 146–147.

Figure 10:
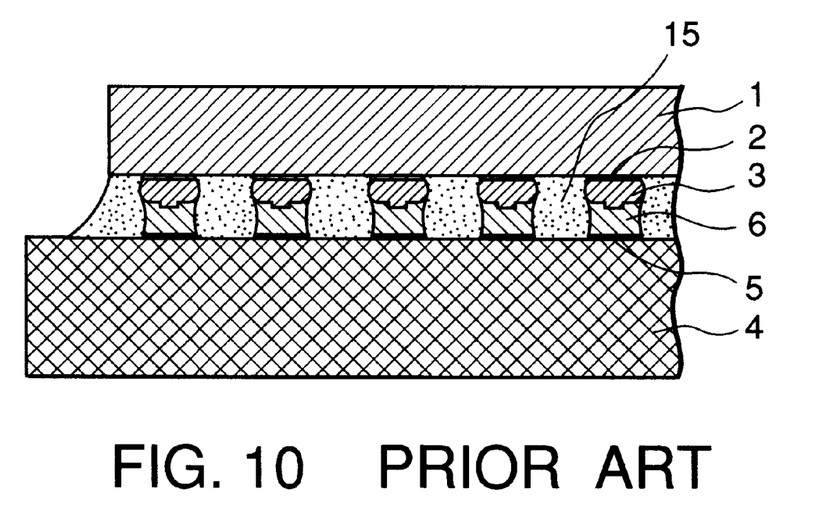
FIG. 10 is a sectional view showing a conventional packaging structure for a semiconductor device.

In the conventional packaging structure for the semiconductor device as shown in FIG. 10, a semiconductor chip 1 is packaged on a wiring board 4 in flip-chip mode, and Au bumps 3 on chip electrodes 2 and solder bumps 6 on board electrodes 5 are connected with each other. Further, a sealing resin 15 is filled in the gap between the semiconductor chip 1 and the wiring board 4, where a filler material such as spherical silica ($SiO_2$) is uniformly dispersed in the sealing resin.

In the conventional packaging structure for the semiconductor device, when a printed board having a glass epoxy as the base material is used as the wiring board, the coefficients of thermal expansion of the printed board and the semiconductor chip which is generally made of silicon, with values of about $3 \times 10^{-6}$ m/° C. and about $14 \times 10^{-6}$ m/° C., respectively, differ to a large extent. The large difference of the coefficient of thermal expansion gives rise to a stress in connection parts of the electrodes and the bumps of respective components. If a resin is used as the material for the wiring board, the difference in the coefficient of thermal expansion is further increased and the stress is increased correspondingly. Accordingly, it becomes necessary to reduce the coefficient of thermal expansion of the sealing resin after curing in order to relax the stress in the connection parts. In order to suppress the coefficient of thermal expansion of the sealing resin to a smaller range, it is necessary to mix a filler, such as spherical silica, which is a material of low coefficient of thermal expansion, to a base resin of the sealing resin.

However, an increase in mixing ratio of the filler leads to problems such as those in the following. Namely, when the mixing ratio of the filler in the sealing resin is increased, the overall viscosity of the resin goes up. In filling the sealing resin into the gap between the semiconductor chip and the wiring board, the capillary phenomenon is generally utilized. So when the viscosity of the resin becomes high, there is required a longer time for filling the resin and the productivity is deteriorated. Moreover, in a structure of fine pad pitch smaller than 120 μm, filling of the sealing resin may become impossible when the viscosity of the sealing resin is too high.

Furthermore, when the mixing ratio of the filler in the sealing resin is raised, the area, over which the base resin of the sealing resin is adhered to the circuit plane of the semiconductor chip, becomes small due to the presence of a large number of filler particles on the circuit plane of the semiconductor chip. Accordingly, the adhesive power to the semiconductor chip of the sealing resin becomes small, which results in such problems as defective connection parts and corrosion of aluminum in the chip pads.

SUMMARY OF THE INVENTION

It is therefore an object of this invention to provide a packaging structure, and its method, which makes it possible to shorten the filling time of a resin which bonds a semiconductor device such as semiconductor chip to a wiring board, and suppress the stress to the junction parts between the electrode pads of the semiconductor device and the bumps of the wiring board.

It is another object of this invention to provide a packaging structure, and its method, which does not deteriorate the adhesive power between the semiconductor device and the wiring board even when a filler material is mixed in the resin.

The packaging structure for the semiconductor device according to this invention is one in which the semiconductor device is mounted on a wiring board to be connected to electrodes of the wiring board, and a sealing resin formed by mixing a filler material in a base resin to reduce the coefficient of thermal expansion is filled in the gap between the semiconductor device and the wiring board. The semiconductor device is a semiconductor chip or a circuit device mounting the semiconductor chip on a circuit base board. The gap filled by the sealing resin is separated into a first part consisting mostly of the base resin with small quantity of the filler and a second part where the quantity of the filler is larger than that in the first part. In this constitution, the second part has a coefficient of thermal expansion smaller than that of the first part.

Since it is desirable to have less amount of the filler material in the first part, and the filler material in the second part needs only be mixed to an appropriate degree, it is possible to reduce the amount of the filler material and shorten the filling time of the sealing resin by lowering the viscosity of the sealing resin, compared with the case of the conventional sealing resin in which the filler material is dispersed uniformly. Besides, the adhesive power can be maintained by the first part where the quantity of the filler material is reduced.

In particular, a first layer is formed by arranging the first part on the semiconductor device side, and a second layer is formed by arranging the second part on the wiring board side. In place of forming the first and second layers, the first part may be formed situated at the central part of the gap between the semiconductor device and the wiring board, and the second part may be formed situated at the connection parts of the semiconductor device and the electrodes of the wiring board.

With such a construction, it is possible to reduce effectively the stress in the connection part of the electrodes of the wiring board and the semiconductor device generated due to the difference in the coefficient of thermal expansion of the wiring board and the semiconductor device.

The sealing resin may be separated into a first part where only a base resin free from a filler material exists, and a second part where the filler material and the base resin coexist.

Moreover, the packaging method of this invention includes a filling process and a separation process. In the filling process, a sealing resin, obtained by mixing a filler material for reducing the coefficient of thermal expansion is mixed in a base resin, is filled in the gap between a semiconductor device and a wiring board after the completion of connection of the semiconductor device and electrodes of the wiring board. In the separation process, the sealing resin is separated into a first part with reduced amount of the filler material and a second part with increased amount of the filler material.

In particular, the separation process is characterized in that the filler in the first part is shifted to the second part. The centrifugal method is used in order to carry out the separation effectively.

DETAILED DESCRIPTION OF THE PREFERRED EMBODIMENTS

Referring to the drawings, a first embodiment of the packaging structure for a semiconductor device of this invention will be described in detail.

Figure 1:
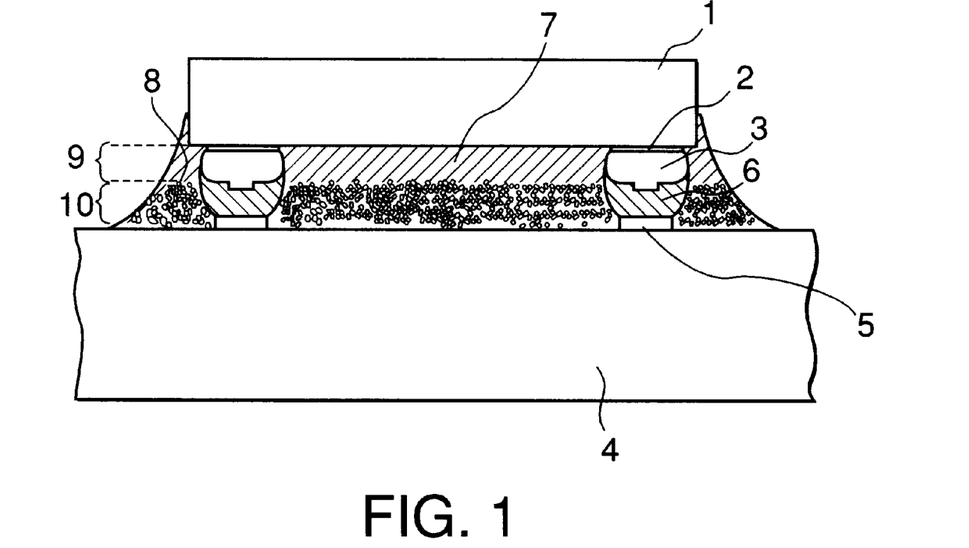
FIG. 1 is a sectional view showing the packaging structure of a semiconductor device according to a first embodiment of the invention.
Figure 2:
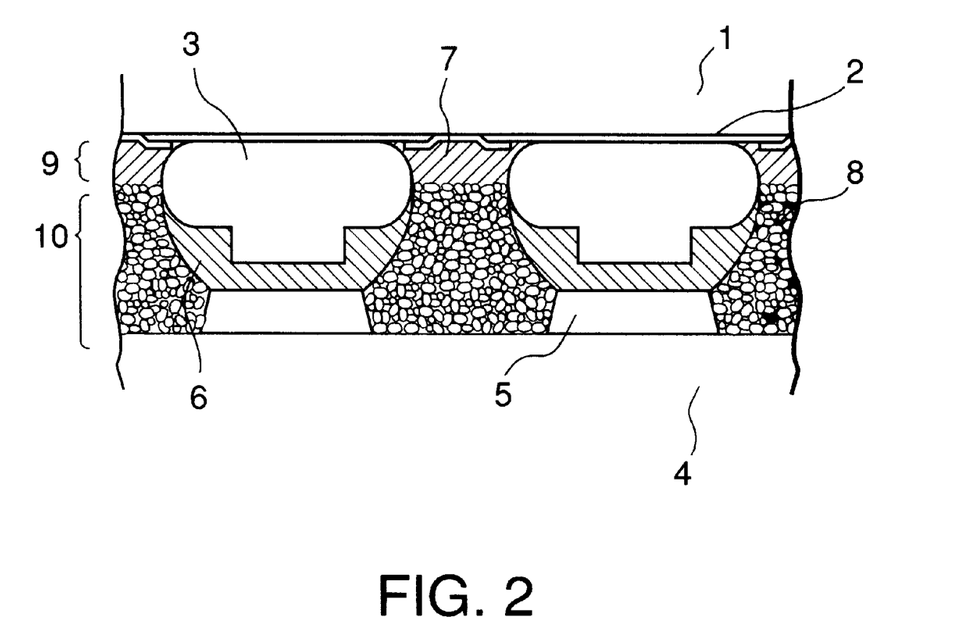
FIG. 2 is an enlarged sectional view of the pad arrangement part in FIG. 1.

In a packaging structure of FIG. 1 and FIG. 2 in which a sealing resin 7 containing a filler material 8 to reduce the coefficient of thermal expansion to be smaller than that of a base resin is filled in the gap between a semiconductor chip 1 and a wiring board 4. The sealing resin is separated into a first part consisting mostly of a base resin with only a small amount of the filler material 8 and a second part having the filler material more than in the first part, and in particular, these two parts form mutually overlapping layers 9 and 10. It is preferable that the first part is composed exclusively of the base resin layer 9 without having any filler material and the second part contains the filler material and the base resin (a mixed layer 10).

Gold (Au) bumps 3 are formed on chip electrodes 2 on the semiconductor chip 1, while solder bumps 6 are formed on board electrodes on the wiring board 4 having a glass epoxy as the base material. The Au bumps 3 and the solder bumps 6 are mutually bonded.

The sealing resin 7 is filled in the gap between the semiconductor chip 1 and the wiring board 4. The sealing resin 7 is formed by mixing the filler material 8 of spherical shape for lowering the coefficient of thermal expansion in a base resin (for example, an epoxy resin). In the state in which the sealing resin 7 is cured after filling it in the gap between the semiconductor chip 1 and the wiring board 4, the base resin layer 9 containing a minimal or no amount of the filler material is formed on a side of the semiconductor device 1, and the mixed layer 10 mixed with an appropriate amount of the filler material 8 and the base resin is formed on a side of the wiring board 4. In this way, the sealing resin 7 filled and cured is separated into the base resin Layer 9 and the mixed layer 10. Provided that it is a material with coefficient of thermal expansion smaller than that of the base resin, any material other than silica ($SiO_2$) may be used as the filler.

Although the ratio of the thickness of the base resin layer 9 to that of the mixed layer 10 can be adjusted by varying the mixing ratio of the filler material 8 in the sealing resin 7, the range from 1:1 to 1:10 is preferable. For example, when the mixing ratio of the filler material 8 in the sealing resin 7 is in the range of 46 to 47 vol. %, the thickness ratio of the layers is 1:2 to 1:3. The ideal condition for the base resin layer 9 is that of completely free from the filler material, and the content of the filler material is to be suppressed to the extent possible.

In the packaging structure of this embodiment, it is possible to suppress the mixing ratio of the filler material 8 to the sealing resin 7 by forming the base resin layer 9. Since it is possible to appropriately lower the overall viscosity of the sealing resin 7 accordingly, the time for filling the sealing resin 7 can be shortened and attain an improvement of in the productivity. In the case of electrode pitch of 120 $\mu$m, the diameter of the Au bumps 3 is 80–95 $\mu$m, and their spacing is 25–40 $\mu$m. In addition, in the case of the electrode pitch of 60 $\mu$m, the diameter of the Au bumps 3 is 45–55 $\mu$m, and their spacing is 5–15 $\mu$m. Even in the case of such a fine pitch, a satisfactory filling of the sealing resin in a short time is possible since the viscosity of the sealing resin can be reduced appropriately.

Moreover, the circuit plane of the semiconductor chip 1 is brought into close contact with the base resin layer 9 of the sealing resin 7, and the filler is absent from the contact plane or present in only a small quantity, so that it is possible to maintain the intrinsic adhesive power of the base resin. Consequently, it is possible to suppress the aluminum corrosion of the chip electrodes 2 caused by the deterioration in the adhesive power between the sealing resin 7 and the circuit plane of the semiconductor chip 1.

Furthermore, since the coefficient of thermal expansion of the mixed layer 10 is smaller than that of the base resin layer 9, the stress caused by thermal expansion and contraction in the wiring board 4 is made less easy to be transmitted to the mixed layer 10. Accordingly, the stress appearing in the connection parts between the chip electrodes 2 and the solder bumps 6 is relaxed and the defective connection can be prevented.

Figure 3:
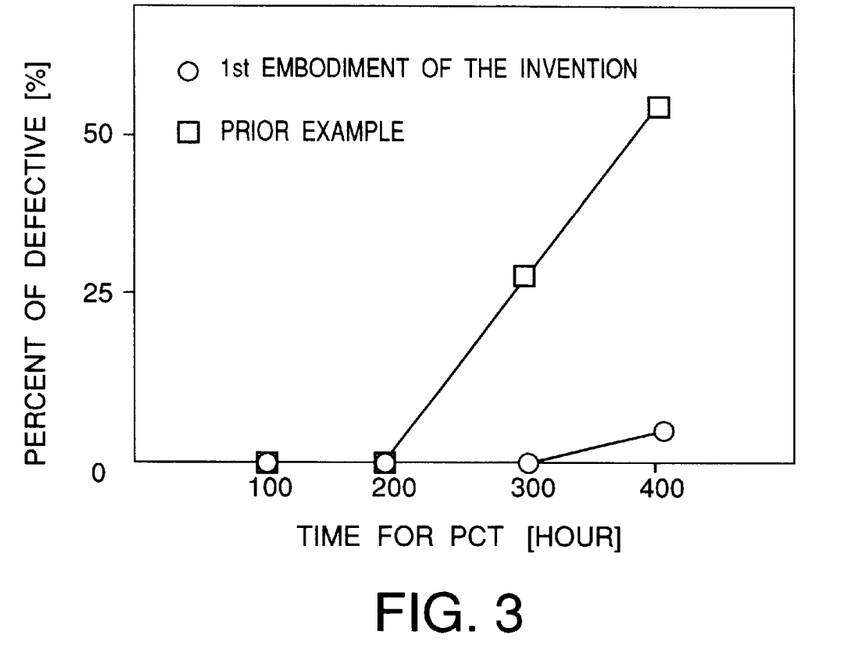
FIG. 3 is a diagram showing the result of comparison by PCT (Pressure cooker test) of the packaging structure shown in FIG. 1 and a conventional packaging structure.

Here, the result of the pressure cooker test (PCT) given to each of the packaging structure for a semiconductor device and the conventional packaging structure will be shown in FIG. 3. It can be seen from the figure that in the conventional packaging structure defectives appear in large number when the testing time of the PCT exceeds 200 h, whereas in the packaging structure of this embodiment defective does not occur until 300 h, indicating an improvement in the reliability. The defective mode in the PCT was exclusively that of oven failure, and was caused by corrosion of the aluminum pad of the electrodes 2.

In this embodiment, the coefficient of thermal expansion of the mixed layer is preferable to be $(20-26) \times 10^{-6}$ m/° C.

In the packaging structure of this embodiment, when the mixing ratio of the filler material 8 is, for example, 46–47 vol. %, the coefficient of thermal expansion of the sealing resin 7 according to normal method of curing is $(25-26) \times 10^{-6}$ m/° C. However, the coefficient of thermal expansion of the mixed layer 10 goes down to $(20-22) \times 10^{-6}$ m/° C., and approaches the coefficient of thermal expansion of $22 \times 10^{-6}$ m/° C. of Sn which is used normally as the main component of the bumps 6.

In this case, the stress applied to the solder bumps 6 in the connection parts of the chip electrodes 2 and the board electrodes 5 owing to large thermal expansion and contraction of the wiring board 4 is further relaxed.

Figure 4:
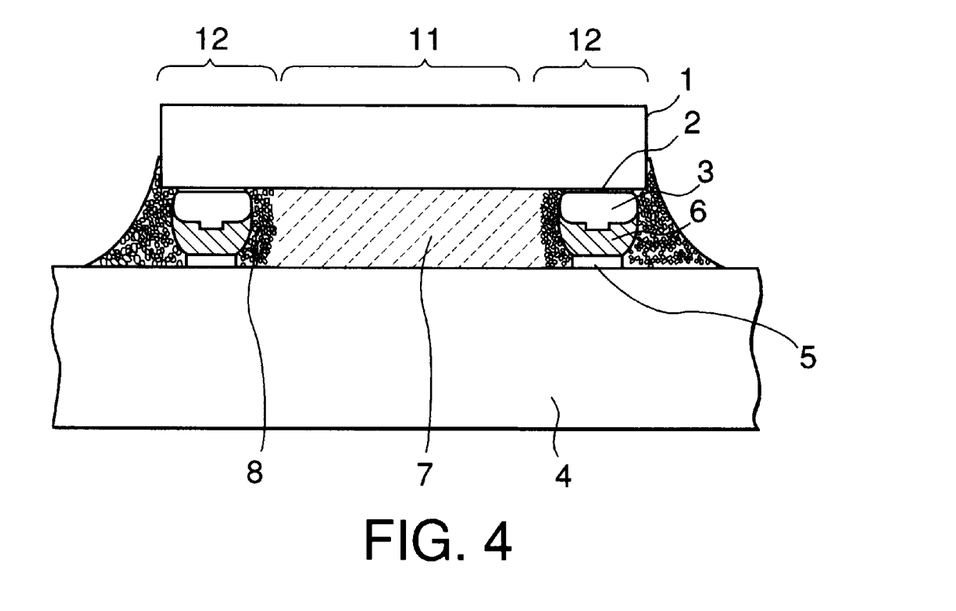
FIG. 4 is a sectional view showing the packaging structure of a semiconductor device according to a second embodiment of the invention.

Next, referring to FIG. 4 and FIG. 5, a second embodiment of the packaging structure for a semiconductor device according to this invention will be described. FIG. 4 is a sectional view showing the configuration in the vicinity of the central part of the chip in the packaging structure of this embodiment, and FIG. 5 is a plan view showing the packaging structure of this embodiment.

Figure 5:
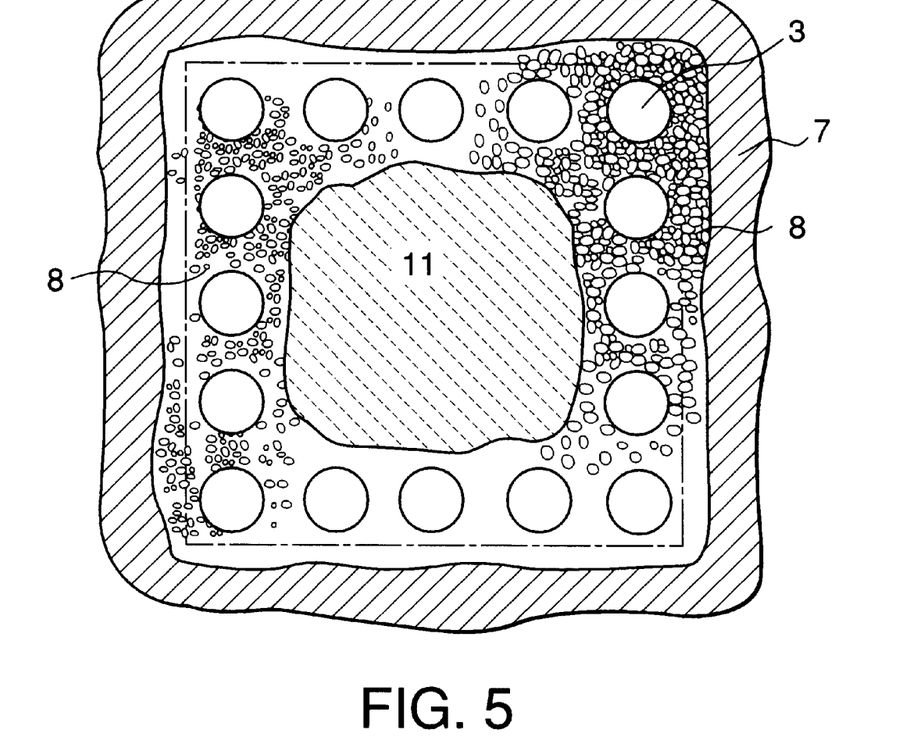
FIG. 5 is a perspective plane view showing the packaging structure of a semiconductor device according to the second embodiment.

Referring to FIG. 4 and FIG. 5, Au bumps 3 are formed on the chip electrodes 2 on the semiconductor chip 1 while solder bumps 6 are formed on the board electrodes 5 on the wiring board 4 having a glass epoxy as the base material.

The sealing resin 7 is filled in the gap between the semiconductor chip 1 and the wiring board 4. Mixed in the sealing resin 7 is the filler material 8 composed of spherical silica particles. In the state where the sealing resin 7 is filled and cured in the gap between. the semiconductor chip 1 and the wiring board 4, a base resin part 11 which consists exclusively of the base resin such as the epoxy resin, or a minimum amount of the filler material mixed therewith, is formed in the vicinity of the central part of the semiconductor chip 1. At the same time, mixed parts 12 where an appropriate amount of the filler material 8 is mixed with the base resin are formed in the vicinity of the connection parts of the Au bumps 3 and the solder bumps 6.

In the packaging structure of this embodiment, the periphery of the connection part of the Au bump 3 and the solder bump 6 is held by the mixed part 12, but the mixed part 12 has a smaller coefficient of thermal expansion because of the concentration of the filler material 8. Accordingly, the thermal stress appearing in the connection part of the Au bump 3 and the solder bump 6 is relaxed and the destruction of the connection part by heat cycles can be prevented.

Moreover, in the region where the connection part of the Au bump 3 and the solder bump 6 is absent (vicinity of the central part of the semiconductor chip 1 in this embodiment), the base resin part 11 with no or minimum amount of the filler material 8 mixed is brought to close contact with the circuit plane of the semiconductor chip 1. Accordingly, it is possible to maintain a sufficiently high adhesive power.

Furthermore, since it is possible to reduce the mixing ratio of the filler 8 in the sealing resin 7, the same effect as that described in connection with the first embodiment can be secured.

Although the flip-chip connection using Au bumps 3 and solder bumps 6 has been described in the first and second embodiments, the present invention is applicable to all types of flip-chip connection in which sealing resin is filled to be cured after completion of the flip-chip connection.

For example, this invention is applicable to a packaging structure in which connection is realized by the use of Au bumps and a conductive adhesive resin, a packaging structure in which connection is realized by the use of a Sn/Pb solder, Sn-based solder, In-based solder or Pb-based solder, and a packaging structure in which connection is realized by the use of Au bumps and Au plating on the wiring of the board.

Analogously, the wiring board 4 in this invention is not limited to a printed board which has a glass epoxy as the base material, and is applicable also to an aluminum board, glass ceramic board, flexible board, glass board or the like. In addition, it is preferred to use an epoxy resin as the base resin of the sealing resin, and set the average particle diameter of the spherical silica filter to be 1–5 $\mu$m, with the maximum particle diameter to be less than 20 $\mu$m for electrode pitch of 120 $\mu$m and less than 5 $\mu$m for the electrode pitch of 80 $\mu$m.

Next, referring to FIG. 1 and FIG. 6, an embodiment of the packaging method for a semiconductor device of this invention will be described. The packaging method according to this embodiment is a packaging method for forming the packaging structure for a semiconductor device described in the first embodiment of the invention in the above.

Figure 6:
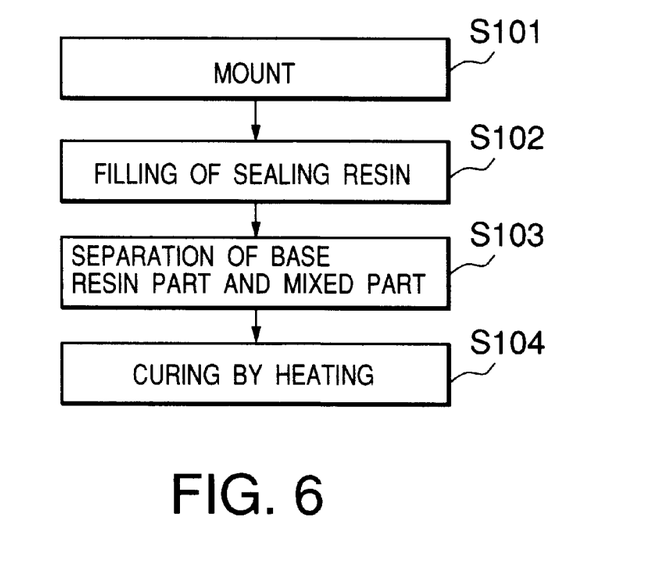
FIG. 6 is a flow chart showing the procedure of an embodiment of packaging method for a semiconductor device according to this invention

First, in FIG. 6, the semiconductor chip is mounted on (connected to) the wiring board in flip-chip mode (S101). In the present connection method, known techniques in all types of the above-mentioned flip-chip connection methods are applicable as long as no particular adverse effect occurs in carrying out the packaging.

After mounting the semiconductor chip on the wiring board, the sealing resin is filled in the gap between the semiconductor chip and the wiring board (S102). Namely, by dripping the sealing resin in the vicinity of the semiconductor chip, the sealing resin is filled in the gap by the action of the capillary phenomenon.

The filled sealing resin is separated into the base resin layer 9 and the mixed layer 10 where the base resin and the filler 8 coexist (S103) as shown in FIG. 1.

Figure 7:
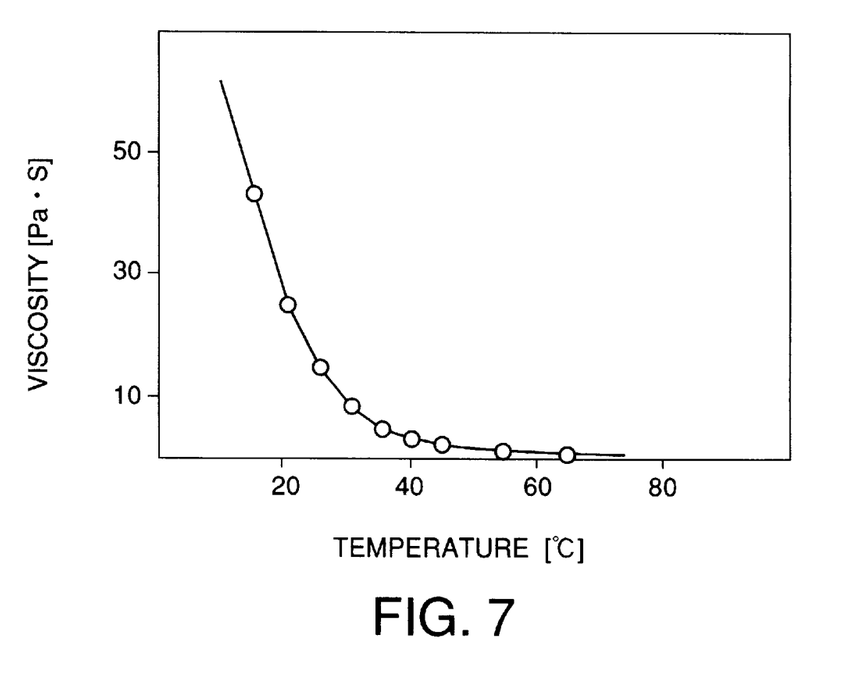
FIG. 7 is a diagram showing the dependence on the temperature of the viscosity of the sealing resin.

More specifically, in FIG. 1, the entire system of the semiconductor chip 1, wiring board 4, and sealing resin 7 is held, with the wiring board 4 situated on the lower side, and it is heated for 50 min at 70° C. By the heating, the viscosity of the sealing resin 7 drops down to 2 Pa·s at 70° C., as shown in FIG. 7. Accordingly, the filler material 8 in the sealing resin 7 moves to the side of the wiring board 4 by the gravitational action, and the sealing resin 7 is separated into the base resin layer 9 and the mixed layer 10 of the base resin and the filler 8. In the heating at 70° C., the movement of the filler material 8 is complete in about 50 min.

The ratio of the thicknesses of the base resin layer 9 and the mixed layer 10 can be varied by adjusting the heating temperature and the heating time. For example, by raising the heating temperature and extending the heating time it is possible to increase the thickness of the base resin layer 9 and reduce the thickness of the mixed layer 10. It is preferable that the heating temperature is set at about 80° C. which is higher than 40° C. where the viscosity of the sealing resin 7 is lower than 5 Pa·s, and is lower than 100° C. of the curing temperature of the sealing resin 7.

After the completion of the separation process of the filled sealing resin 7 as in the above, the sealing resin 7 is heated to be cured (S104). The heating temperature and the heating time for curing the sealing resin 7 are set at optimum values corresponding to the kind of the resin, packaging structure and the like.

Next, referring to FIG. 8, another embodiment of the packaging method for a semiconductor device of this invention will be described.

The packaging method of this embodiment is a packaging method for forming the packaging structure for a semiconductor device described in the first embodiment, and is similar to the packaging method in the first embodiment except the separation process of the base layer and the mixed layer in S103 among the procedure of the packaging method shown in FIG. 6. Under these circumstances, the separation process will be described in particular omitting the description for the overlapped portions.

Figure 8:
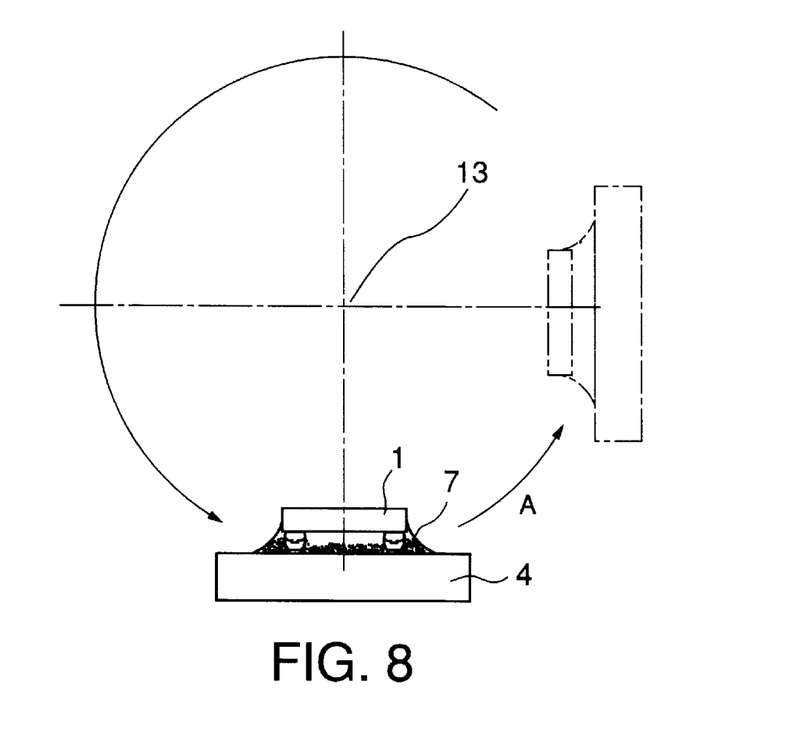
FIG. 8 is a diagram for describing the principle of another embodiment of the packaging method for a semiconductor device according to the invention.

In FIG. 8 which is a diagram for describing the principle of the packaging method for a semiconductor device according to this embodiment, after mounting the semiconductor chip 1 on the wiring board 4, in the state where the sealing resin 7 is filled in the gap between the semiconductor chip 1 and the wiring board 4, the whole system is rotated in the direction of an arrow A around a point 13 distant from the surface of the semiconductor chip 1. By virtue of the centrifugal force produced by the rotation, the filler 8 particles in the sealing resin 7 are collected toward the wiring board 4, and the sealing resin 7 is separated so as to form the base layer 9 on the semiconductor chip 1 side and the mixed layer 10 on the wiring board 4 side as shown in FIG. 1. Then, by heating the entirety of the semiconductor chip 1 and the wiring board 4 to 40–80° C., the viscosity of the sealing resin 7 is reduced so as to cause the filler 8 particles move more effecitvely toward the side of the wiring board 4.

The process of curing the sealing resin 7 by heating which is introduced following the separation process may be provided either by stopping or while maintaining the rotation of the packaging structure.

Next, referring to FIG. 9, still another embodiment of the packaging method for a semiconductor device according to this invention will be described.

The packaging method of this embodiment is a method for forming the packaging structure for a semiconductor device according to the second embodiment described with reference to FIG. 4 and FIG. 5. In this method, processes other than the separation process of the base resin layer and the mixed layer in S103 among the procedures for the packaging method shown in FIG. 6 are similar to those of the packaging methods for the first embodiments. Accordingly, description as to the overlapped portions will be omitted and only the separation process will be described in particular.

Figure 9:
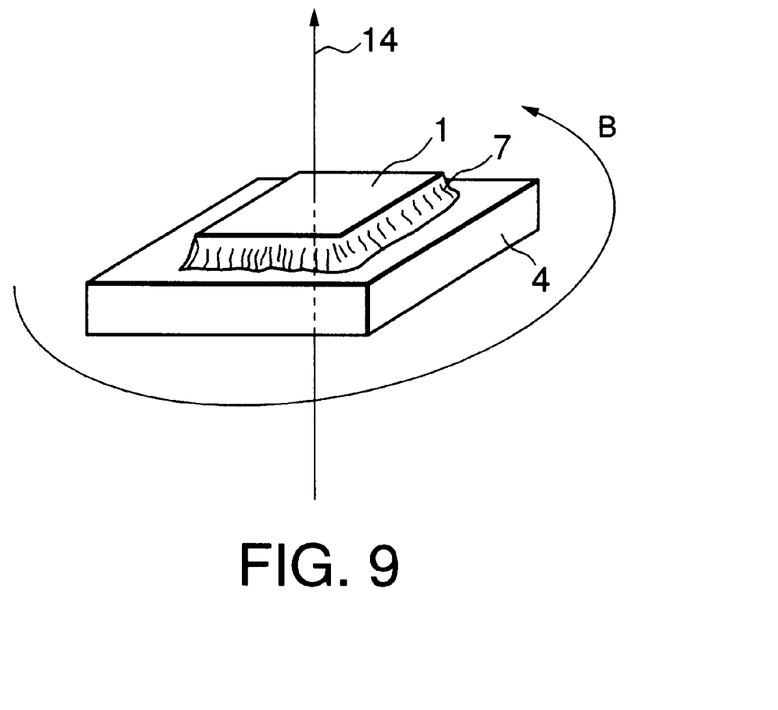
FIG. 9 is a diagram for describing the principle of still another embodiment of the packaging method for a semiconductor device according to the invention.

FIG. 9 is a diagram for describing the principle of the packaging method of a semiconductor device of this embodiment. In the figure, after mounting the semiconductor chip 1 on the wiring board 4, in the state where the sealing resin 7 is filled in the gap between the semiconductor chip 1 and the wiring board 4, the system is subjected to a rotation in the direction of an arrow B around a rotation axis 14 passing through the center of the semiconductor chip 1 and perpendicular to the surface of the chip 1. By virtue of the centrigual force produced by the rotation, the filler 8 particles in the sealing resin 7 are collected in the vicinity of the connection parts of the Au bumps 3 and the solder bumps 6 situated in the periphery of the semiconductor chip 1 as shown in FIG. 4. Accordingly, the sealing resin 7 is separated into the base resin part 11 formed in the vicinity of the central part of the semiconductor chip 1, and the mixing parts 12 formed in the vicinity of the connection parts of the Au bumps 3 and the solder bumps 6. By subjecting the entire system of the semiconductor chip 1 and the wiring board 4 to a heating at a temperature in the range of 40–80° C., it is possible to reduce the viscosity of the sealing resin and cause the filler 8 particles to move more effectively.

As described in the above, by the packaging structures for a semiconductor device according to this invention, the mixing ratio of spherical filler particles before the filling of the sealing resin can be lowered, and the overall viscosity of the sealing resin can be reduced so that it is possible to shorten the filling time of the sealing resin, and satisfactorily carry out the filling of the sealing resin even for structures with a fine pitch.

Moreover, the adhesive force between the circuit plane of the semiconductor chip and the sealing resin can be increased so that it is possible to suppress the corrosion of aluminum of the chip pads caused by the deterioration in the adhesive force.

Furthermore, the coefficient of thermal expansion of the mixed layer is made small because of the concentration of the filler particle. It is possible to relax the stress exerted on the solder bumps in the connection parts of the chip electrodes and the board electrodes, and prevent the destribution of the connection parts due to heat cycles.

What is claimed is:

1. A packaging structure for a semiconductor device comprising:

said semiconductor device;

a wiring board which mounts said semiconductor device and has electrodes for connecting said semiconductor device mounted thereon; and a sealing resin filled in a gap between said semiconductor device and said wiring board, said sealing resin in said gap having a base resin and a filler material in said base resin for reducing a coefficient of thermal expansion, and said resin in said gap being separated into a first part containing only a small amount of said filler material and being composed mostly of said base resin and a second part containing said filler material in an amount larger than in said first part.

2. The packaging structure for the semiconductor device as claimed in claim 1, wherein said filler material is absent from said first part and said filler material and said base resin coexist in said second part.

3. The packaging structure for the semiconductor device as claimed in claim 1, wherein said first part and said second part overlap with each other in said gap between said semiconductor device and said wiring board and said first part forms a first layer and said second parts forms a second layer.

4. The packaging structure for the semiconductor device as claimed in claim 3, wherein said first layer is arranged on a side of said semiconductor device and said second layer is arranged on a side of said wiring board.

5. The packaging structure for the semiconductor device as claimed in claim 4, wherein a thickness ratio of said first layer to said second layer lies in the range of 1:1 to 1:10.

6. The packaging structure for the semiconductor device as claimed in claim 1, wherein said first part is arranged in a vicinity of a center of said semiconductor device and said second part is arranged in a vicinity of connection parts of said semiconductor device and the electrodes of said wiring board.

7. In a packaging structure for a semiconductor device in which first bumps formed on a semiconductor device and second bumps formed on a wiring board are bonded and a sealing resin is filled in a gap between said semiconductor device and said wiring board, the packaging structure for a semiconductor device characterized in that said sealing resin in said gap is separated into a first layer brought into close contact with a circuit plane of said semiconductor device and a second layer arranged on said wiring board and formed of a material having a coefficient of thermal expansion lower than that of a material forming said first layer.

8. The packaging structure for the semiconductor device as claimed in claim 7, wherein only a base resin constituting said sealing resin is present in said first layer, and said base resin and a filler material having a coefficient of thermal expansion lower than that of the base resin coexist in said second layer.

9. In a packaging method for a semiconductor device in which said semiconductor device is connected to electrodes of a wiring board by mounting the semiconductor device on said wiring board, the packaging method for a semiconductor device comprising steps of, filling a sealing resin, obtained by mixing a filler material in a base resin for lowering the coefficient of thermal expansion, in a gap between said semiconductor device and said wiring board after completion of a connection of said semiconductor device to the electrodes of said wiring board, and after the filling, separating said sealing resin into a first part in which the amount of said filler material is decreased and a second part in which the amount of said filler material is increased.

10. The packaging method for the semiconductor device as claimed in claim 9, wherein said step of separation is performed by moving the filler material in said first part to said second part.

11. The packaging method for the semiconductor device as claimed in claim 10, wherein said step of separation is performed by lowering viscosity of said sealing resin by heating said semiconductor device and said wiring board, and moving said filler material contained in said sealing resin to said second part.

12. The packaging method for the semiconductor device as claimed in claim 11, wherein said semiconductor device and said wiring board are heated to a temperature at which the viscosity of said sealing resin is brought to below 5 Pa·s.

13. The packaging method for the semiconductor device as claimed in claim 10, wherein said step of separation is performed by moving said filler material contained in said sealing resin to said second part by an action of centrifugal force.

14. The packaging method for the semiconductor device as claimed in claim 13, said centrifugal force is generated by rotating said semiconductor device and said wiring board around a point distant from said semiconductor device, after completion of filling said sealing resin.

15. The packaging method for the semiconductor device as claimed in claim 13, said centrifugal force is generated by rotating said semiconductor device and said wiring board around a center axis passing through a center of said semiconductor device and perpendicular to a surface of said semiconductor device, after completion of filling said sealing resin.

* * * * *